United States Patent
Kwong

(10) Patent No.: US 6,424,217 B1
(45) Date of Patent: Jul. 23, 2002

(54) CMOS LOW-VOLTAGE PECL DRIVER WITH INITIAL CURRENT BOOST

(75) Inventor: David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/682,459

(22) Filed: Sep. 5, 2001

(51) Int. Cl.[7] .................................................. H03F 3/45
(52) U.S. Cl. .......................................... 330/253; 330/9
(58) Field of Search ..................................... 330/9, 253

(56) References Cited

U.S. PATENT DOCUMENTS

| | | | |
|---|---|---|---|
| 4,709,169 A | 11/1987 | Ashton et al. .............. 307/455 |
| 4,999,519 A | 3/1991 | Kitsukawa et al. ......... 307/446 |
| 5,023,488 A | 6/1991 | Gunning .................... 307/475 |
| 5,216,297 A | 6/1993 | Proebsting ................. 307/475 |
| 5,495,184 A | 2/1996 | Des Rosiers et al. ........ 326/73 |
| 5,541,527 A | 7/1996 | Hae-Ting Ma ............... 326/21 |
| 5,548,230 A | 8/1996 | Gerson et al. .............. 326/73 |
| 5,684,429 A | * 11/1997 | Sanwo et al. .............. 327/321 |
| 5,874,837 A | 2/1999 | Monohar et al. ............ 326/83 |
| 5,966,032 A | 10/1999 | Ueda et al. ................. 326/66 |
| 6,140,872 A | * 10/2000 | McEldowney .............. 330/253 |
| 6,157,586 A | 12/2000 | Ooishi ..................... 3654/205 |
| 6,191,643 B1 | 2/2001 | Nayebi et al. ............. 327/536 |

* cited by examiner

*Primary Examiner*—Robert Pascal
*Assistant Examiner*—Khanh Van Nguyen
(74) *Attorney, Agent, or Firm*—Stuart T. Auvinen

(57) ABSTRACT

A differential amplifier has a boosted sink current that is turned on by a pulse generator when the output is driven low. This boosted sink current quickly lowers the output to the voltage-output-low VOL level. After the pulse ends, the sink current ends and power is reduced to a lower standby level. A differential pair of switches receives the true and complement data. One switch is closed when the data is true, connecting a current source that sets the standby voltage-output-high VOH level. The other switch is closed when the complement data is high, connecting another current source that sets the standby VOL level. A second differential amplifier with reversed true and complement data drives a complement output for a differential signaling transmitter, such as for a pseudo-emitter-coupled logic (PECL) driver.

20 Claims, 7 Drawing Sheets

CMOS LOW-VOLTAGE PECL DRIVER WITH INITIAL CURRENT BOOST

BACKGROUND OF INVENTION

This invention relates to differential signaling drivers, and more particularly pseudo-emitter-coupled logic (PECL) drivers.

Low-power circuits have employed full-voltage-swing signaling. For example, a complementary metal-oxide-semiconductor (CMOS) output can swing from ground to the power-supply voltage, such as 0–5 or 0–3 volts. However, as signal speeds increase, unwanted electromagnetic interference (EMI) is increasingly generated, and signal quality deteriorates due to reflections, ringing, and voltage undershoot.

Reducing the voltage swing reduces these undesirable effects. However, noise margin is also reduced as the voltage swing is cut. Noise margin can be improved by using two signal wires to transmit a logical signal, rather than just one wire. Such differential signaling has been used for many years in bipolar emitter-coupled logic (ECL) systems.

More recently, the benefits of differential ECL signaling and low-power CMOS have been combined in what is known as pseudo-emitter-coupled logic (PECL). PECL uses differential signaling and current-steering through CMOS transistors. Data rates as high as 1 Giga-bit per second are desired.

FIG. 1A shows a differential signaling scheme. Driver 10 drives lines Y1, Y2 with opposite data. Current is steered among lines Y1, Y2 so that the amount of current passing through each of resistors 14 varies with the data. The I*R voltage drop across resistors 14 can be sensed by receiver 12. The other terminal of resistors 14 is connected to terminating voltage VTT.

FIG. 1B highlights the small voltage swing of differential signaling. Lines Y1, Y2 are driven to opposite states, depending on the data transmitted. The logic high level is reached when Y1 is driven to a VOH voltage, while the complement line Y2 is driven to a VOL level. For the logic low level, Y1 is driven to the VOL voltage, while the complement line Y2 is driven high to a VOH level.

To minimize EMI radiation and signal distortion, VOH and VOL are chosen to be close to each other. This minimizes the voltage swing from VOL to VOH. For example, VOL can be set to 1.66 volts, while VOH is set to 2.33 volts in systems with 3-volt supplies. The signal swing is thus reduced to about 700 mV. The terminating voltage VTT can be set to 2 volts below Vcc, or about 1.3 volts. This is below both VOH and VOL.

When 50-ohm terminating resistors are used for lines Y1, Y2, the amount of current to produce the desired VOH and VOL levels can be calculated using Ohm's law. The current switched is I=V/R=0.33v/50=6.6 mA.

FIG. 2 shows a prior-art differential amplifier for driving a pair of differential outputs. Bias circuit 20 generates bias voltages for current sources 22, 24 and current sink 26 that produce the target current values I1 and I2. Data control circuit 30 receives the data input DIN and generates true and complement data signals. The complement data is applied to the gate of differential transistor 28, while the true data is applied to the gate of differential transistor 29.

When the data is high, the gate of differential transistor 29 is at a high voltage, causing it to conduct current I1 from current source 24 to current sink 26. This causes output Y2 to fall in voltage to VOL. Since the complement data is low, the gate of differential transistor 28 is low, reducing the current through differential transistor 28. The effective resistance of differential transistor 28 rises, causing line Y1 to rise in voltage. The I1 current from current source 22 is diverted to charging line Y1. Thus Y1 rises in voltage to VOH while Y2 falls in voltage to VOL.

When differential transistor 28 completely turns off, VOH is I1*50 ohm above VTT. Current I1 can then be designed to meet a desired VOH. Voltage VOL is (I2–I1)*50 ohm above VTT, which is the excess sinking current from current sink 26 that discharges line Y2 through the 50-ohm terminating resistor.

While such a differential driver is useful, large currents I1, I2 are needed to quickly charge and discharge the Y1, Y2 lines when high speeds are necessary. However, these currents may also be limited by VOH, VOL requirements, limiting the switching speed.

Another problem is that a large standby current is required by the differential driver. Current sources 22, 24 and current sink 26 remain on after the data has switched to maintain VOH and VOL levels on lines Y1, Y2. The large currents needed for high-speed switching causes a large power drain even when no switching occurs. This is undesirable for low-power applications.

What is desired is a differential driver for low-power applications. A PECL driver with low-voltage swing is desirable. A high-switching speed differential driver with low standby power is desired.

DETAILED DESCRIPTION

The present invention relates to an improvement in low-power differential drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that high switching speed requires high current, but low standby power requires low currents in a differential driver. To meet these divergent goals, the inventor boosts current during switching to improve switching speed, but reduces current once switching has occurred to maintain a low standby power.

Two differential amplifiers are used to drive the two signal line, rather than just one differential amplifier. Using two differential amplifiers rather than just one allows for better control of the currents.

Figure 1A:
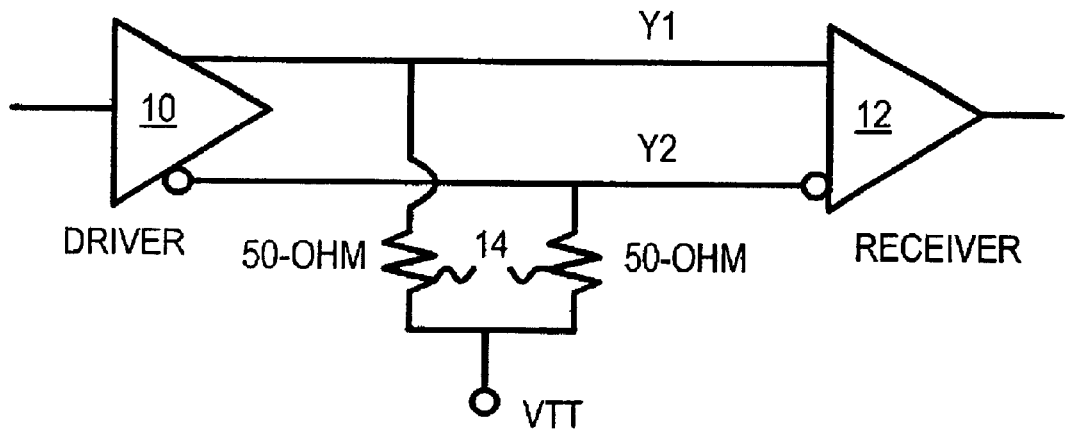
FIG. 1A shows a differential signaling scheme.
Figure 1B:
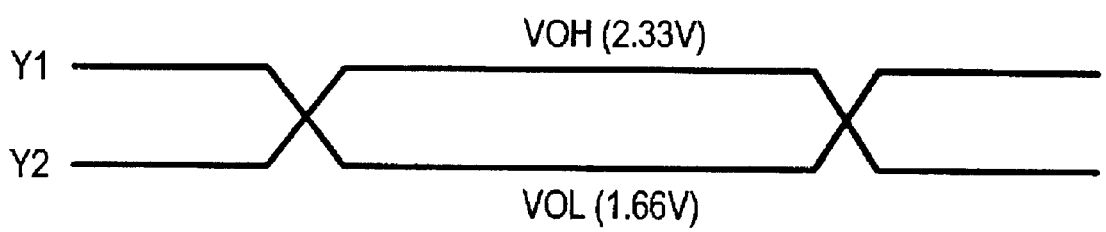
FIG. 1B highlights the small voltage swing of differential signaling.
Figure 2:
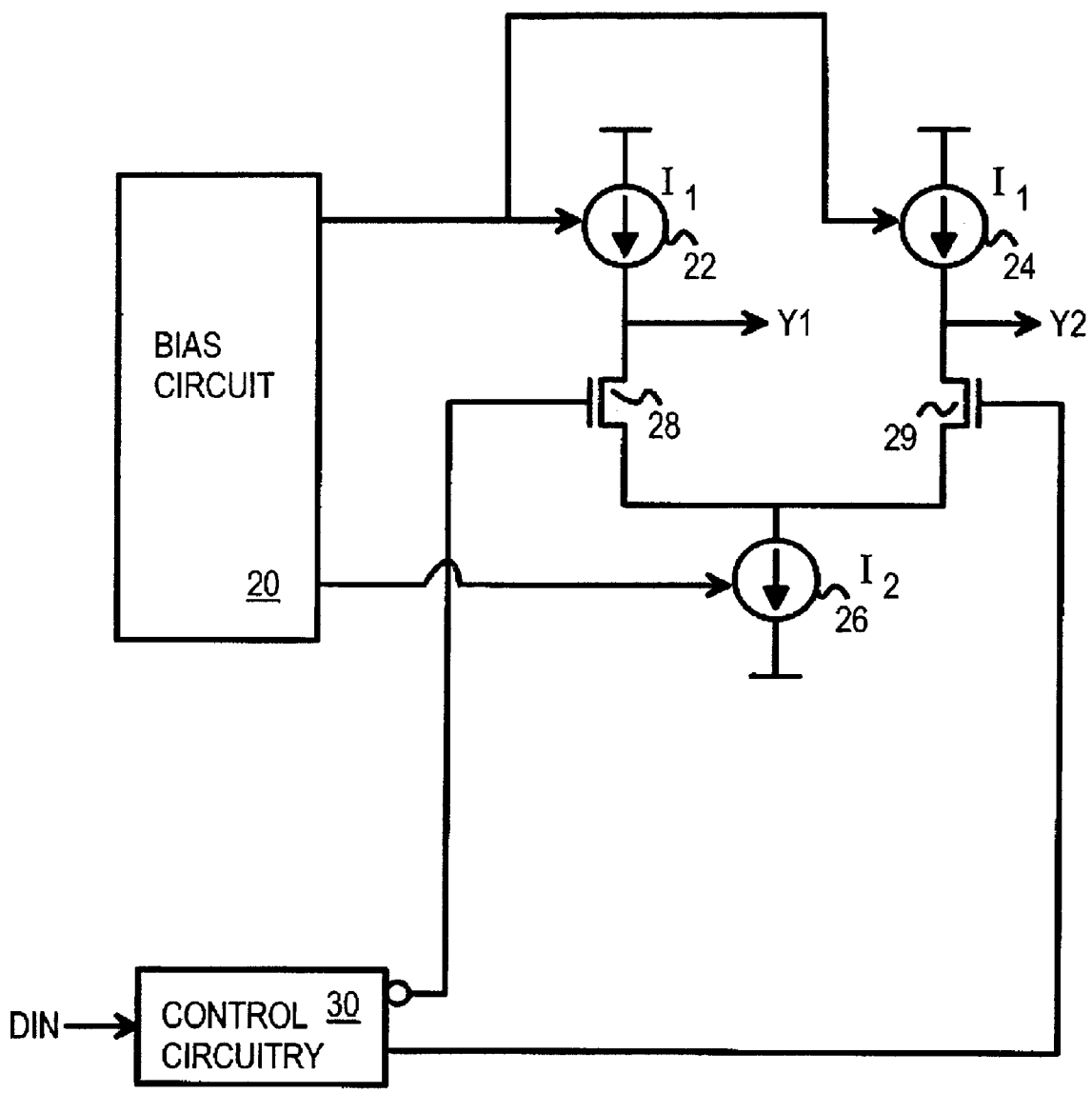
FIG. 2 shows a prior-art differential amplifier for driving a pair of differential outputs.
Figure 3:
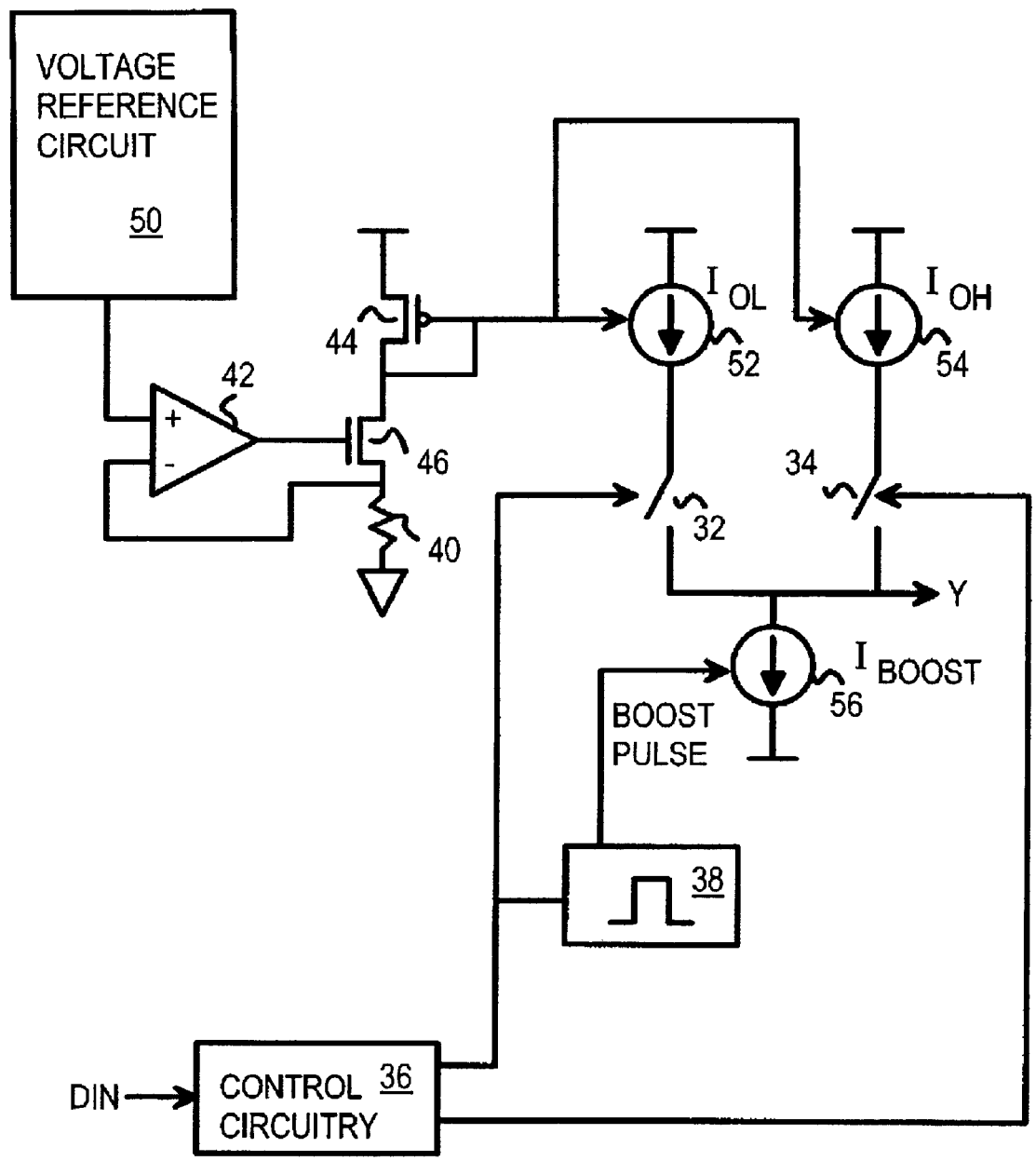
FIG. 3 is a diagram of a current-boosting differential amplifier for driving one of a pair of differential outputs.

FIG. 3 is a diagram of a current-boosting differential amplifier for driving one of a pair of differential outputs. A second amplifier (not shown) is used for driving the other (Y2) line. The second amplifier is the same except that the data control signals from data control circuit 36 to switches 32, 34 are reversed.

The data input signal DIN is buffered by data control circuit 36 to produce true and complement data signals, which control switches 32, 34. When the data is high, and output Y is to be driven high to VOH, switch 32 is open, disconnecting current source 52. Switch 34 is closed, allowing current IOH from current source 54 to reach output Y. Current IOH then charges up output Y to the VOH voltage level.

When the data is low, switch 34 is open, disconnecting current IOH from current source 54. Instead, switch 32 closes, connecting current IOL from current source 52 to output Y. Pulse generator 38 is also activated by the data signal from data control circuit 36. A pulse from pulse generator 38 activates current sink 56, causing current I_boost to be drawn from output Y and current source 52. This additional current boost causes output Y to fall more rapidly to voltage VOL.

After a period of time, pulse generator 38 disables current sink 56, ending the boost current. Then current IOL from current source 52 is used to maintain the VOL level on output Y.

This IOL current flows through an external terminating resistor attached to line Y, such as a 50-ohm resistor to ground or to a terminating voltage VTT that is below VOL.

The VOH level is generated by current IOH flowing through the external terminating resistor (not shown) attached to line Y. The voltage of line Y is driven to a voltage of VTT+IOH*R, where R is the terminating resistance, VTT is the terminating voltage, and IOH is the current from current source 54. Likewise, the VOL level is generated by current IOL flowing through the external terminating resistor (not shown) attached to line Y. The voltage of line Y is driven to a voltage of VTT+IOL*R. Since the currents IOH and IOL can be separately controlled by the biasing and sizes of current sources 52, 54, good optimization and control of the VOH and VOL levels is possible.

Since the boost current from current sink 56 is only on during switching, it does not affect the final (static) VOL, VOH voltage levels. Thus the size of current sink 56 can be independently optimized for fast switching speed without the limitations of VOL and VOH biasing. For example, IOH can be 20 mA while IOL is 5 mA to produce a VOH that is sufficiently above VOL.

Voltage reference circuit 50 can use a band-gap reference to output a reference voltage to comparator 42. Comparator 42 drives the gate of n-channel feedback transistor 46, adjusting its resistance so that the source voltage of n-channel feedback transistor 46 matches the reference voltage. A feedback loop is formed by connecting the source of n-channel feedback transistor 46 to the inverting input of comparator 42.

A bias voltage is generated at the drains of n-channel feedback transistor 46 and p-channel mirror transistor 44. A voltage divider is formed by p-channel mirror transistor 44, n-channel feedback transistor 46, and tail resistor 40, which are in series between power and ground. The gate and drain of p-channel mirror transistor 44 are connected together and output as the bias voltage to current sources 52, 54. This reference circuit can allow for better tracking of power-supply voltage, temperature, and process variations.

Figure 4:
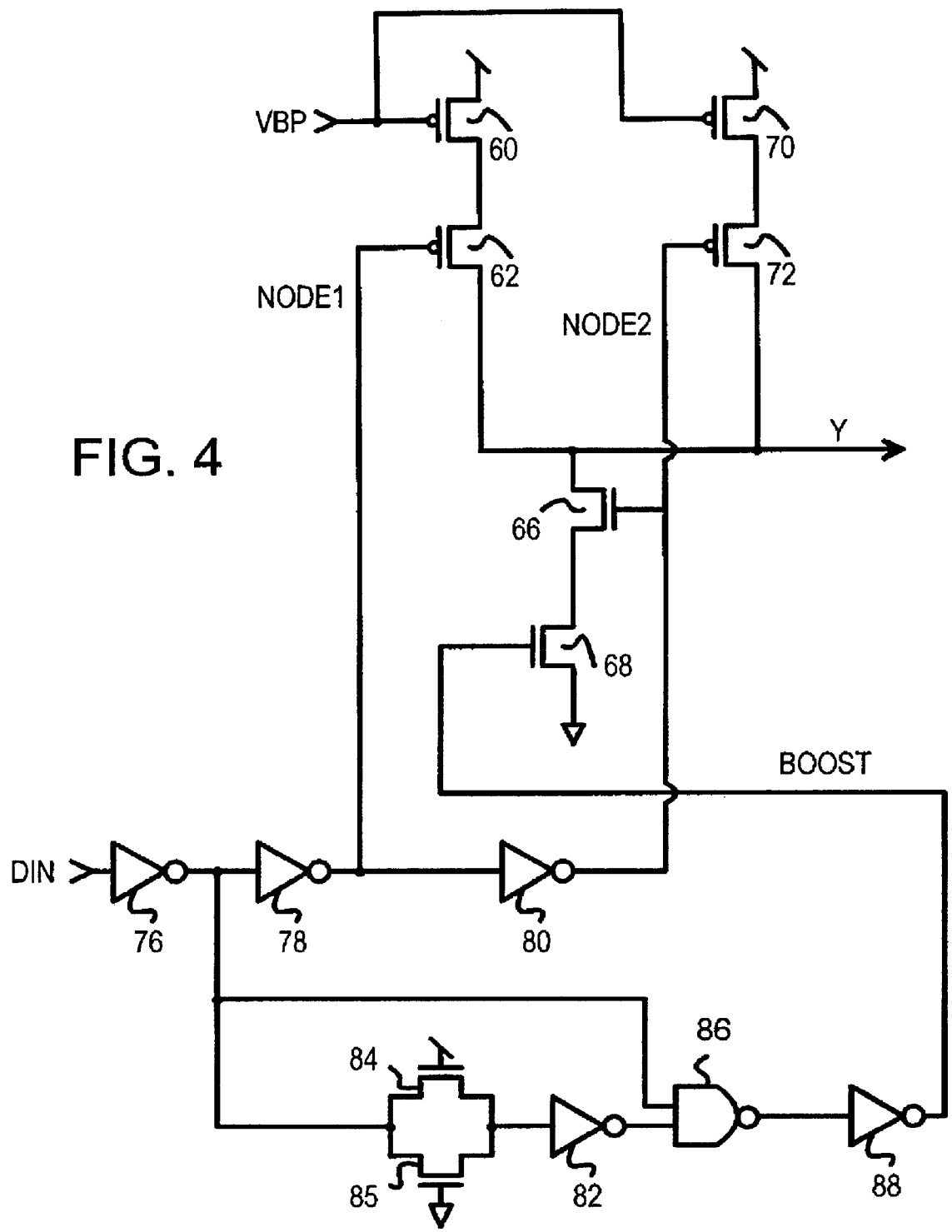
FIG. 4 is a more detailed schematic of the differential amplifier with a current boost for switching.

FIG. 4 is a more detailed schematic of the differential amplifier with a current boost for switching. Current s source transistors 60, 70 are p-channel current sources with gates controlled by the bias voltage VBP. Current source transistor 60 generates IOL while current source transistor 70 generates IOH.

The switches are implemented as p-channel transistors. Switch transistor 62 connects current source transistor 60 to output Y when its gate, NODE1, is low. Switch transistor 72 connects current source transistor 70 to output Y when its gate, NODE2, is low. Since NODE1 is generated by inverters 76, 78 from data input DIN, NODE1 is low when DIN is low. Thus switch transistor 62 is on, connecting current IOL from current source transistor 60 to output Y, when DIN is low, and Y is being driven low to VOL.

NODE2 is generated by inverter 80 from NODE1. NODE2 is therefore low when DIN is high. Switch transistor 72 is turned on, connecting current IOH from current source transistor 70 to output Y, when DIN is high, and Y is being driven high to VOH.

A BOOST pulse is generated when data input DIN transitions from high to low. The inverse data input from inverter 76 is input to NAND gate 86, while the other input to NAND gate 86 is inverted by inverter 82. A delay to widen the pulse width is added by transistors 84, 85 in the path to inverter 82. For a period of time after DIN goes low, both inputs to NAND gate 86 are high before the low passes through transistors 84, 85 and inverter 82. NAND gate 86 outputs a low during this time, which is inverted to an active-high BOOST pulse by inverter 88.

The BOOST pulse is applied to the gate of n-channel boost transistor 68. A boosted sink current I_boost is generated by boost transistor 68 during the BOOST pulse. This current is taken from output Y through connecting transistor 66, which has its gate driven high by inverters 76, 78, 80 once DIN goes low.

The current boost rapidly discharges output Y through boost transistor 68 and connecting transistor 66. This allows output Y to more quickly reach VOL. Once the boost pulse ends, the IOL current from current source transistor 60 keeps output Y at VOL. If the BOOST pulse is too short, the IOL current from current source transistor 60 can also adjust output Y to reach VOL, although at a slower rate.

When the data input DIN is high, the gate of connecting transistor 66 is driven low. Connecting transistor 66 then disconnects output Y from boost transistor 68. This prevents any disturbance of output Y by any false triggering of the pulse generator.

Figure 7:
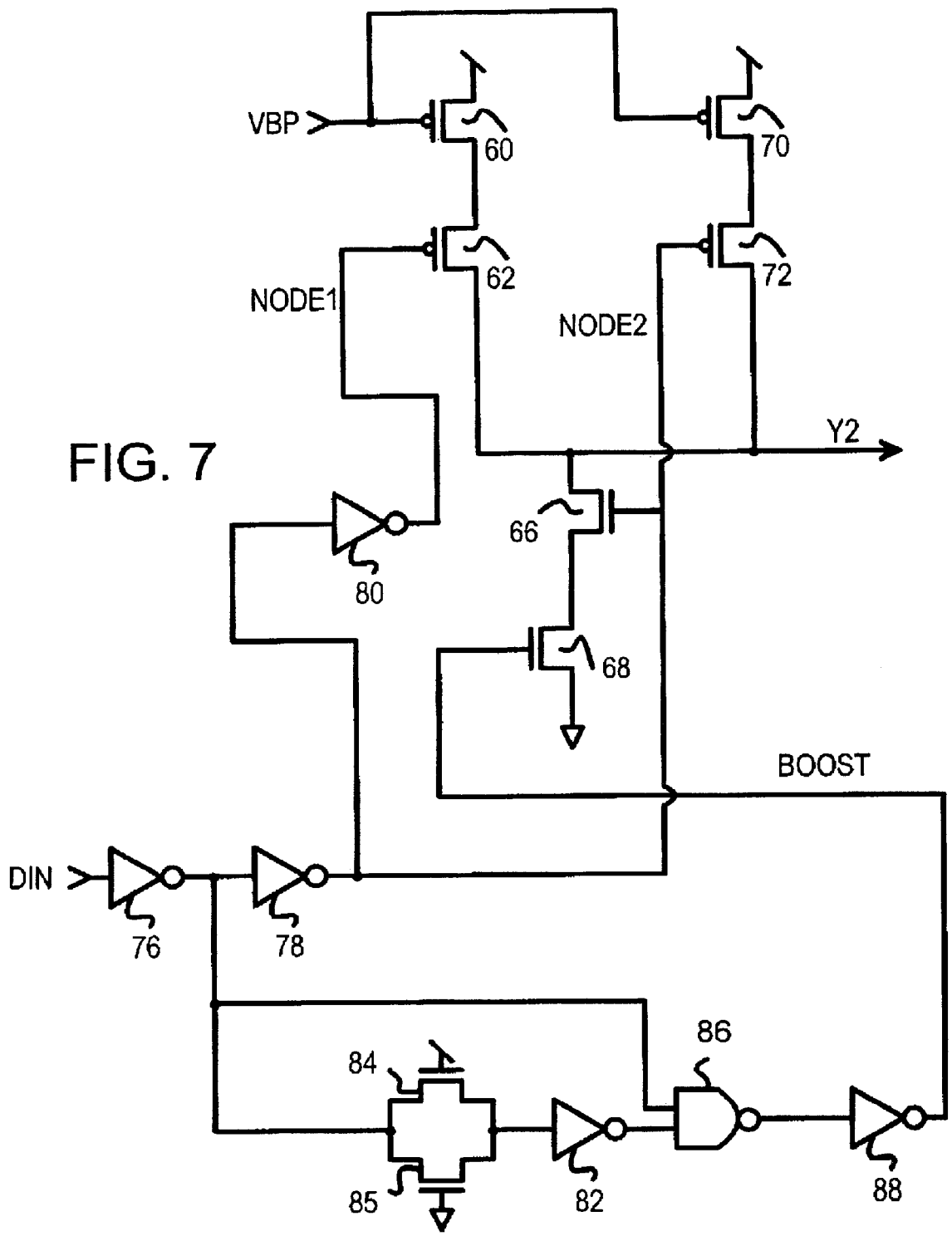
FIG. 7 is a schematic of a complement differential amplifier with a current boost for switching

In FIG. 4, differential output line Y1 is generated as output Y. fig. 7 shows a second amplifier used to generate differential output line Y2. This second amplifier has inverter 78 drive NODE2 to the gates of transistors 72, 66, while inverter 80 drives NODE1 to the gate of transistor 62. Thus a simple reversal of data control signals allows for the complement output Y2 to be generated.

Figure 5:
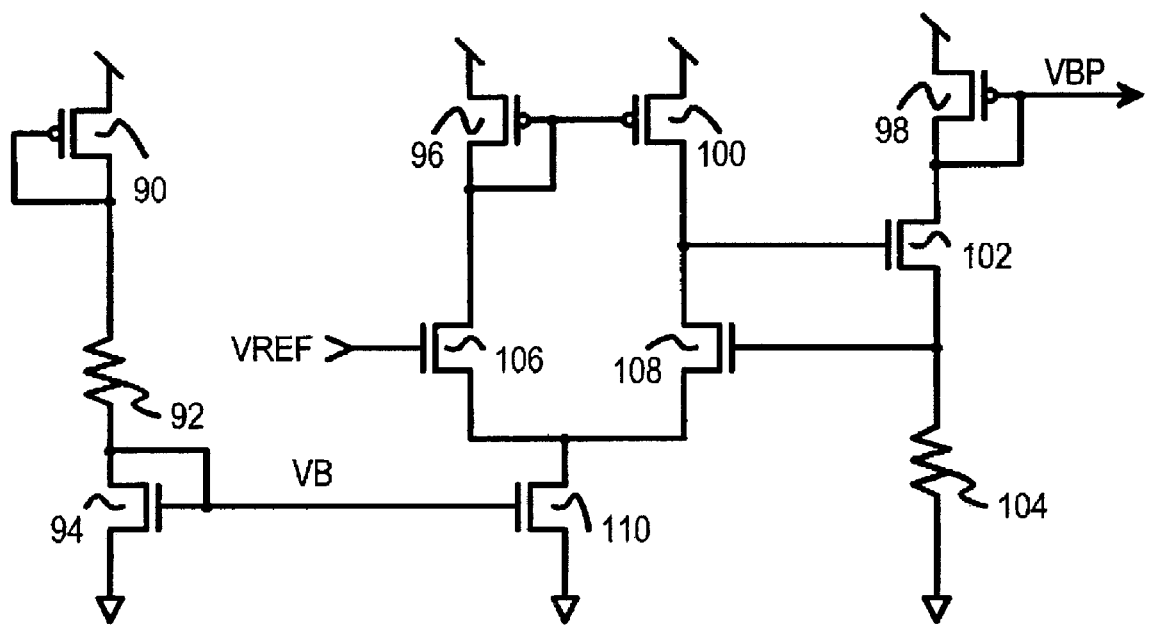
FIG. 5 is a schematic of a voltage-reference circuit that generates the bias voltage for the current sources.

FIG. 5 is a schematic of a voltage-reference circuit that generates the bias voltage for the current sources. Bias voltage VBP is generated by a voltage-divider formed by p-channel transistor 98, n-channel transistor 102, and resistor 104. The gate and drain of p-channel transistor 98 are connected together and output as the bias voltage VBP to the current source transistors 60, 70 of FIG. 4.

A comparator is formed from p-channel mirror transistors 96, 100, n-channel differential transistors 106, 108, and n-channel tail transistor 110. The gates of p-channel mirror transistors 96, 100 are connected together and to the drain of mirror transistor 96. The comparator's output is taken from the drain of mirror transistor 100 and applied to the gate of n-channel transistor 102 to adjust its transconductance (or its resistance).

A voltage reference VREF is generated and applied to the gate of differential transistor 106, and is compared with the source voltage of transistor 102 which is applied to the gate of differential transistor 108. A feedback loop from the comparator adjusts the resistance of transistor 102 until its source voltage matches the reference voltage VREF. This reference voltage can be generated by a band-gap reference or by some other reference circuit.

The tail bias VB to the gate of tail transistor 100 is generated by another voltage divider. The gate and drain of p-channel transistor 90 are connected together and to resistor 92. N-channel mirror transistor 94 is between ground and the other terminal of resistor 92. The gate and drain of n-channel mirror transistor 94 are connected together to determine tail bias VB.

Figure 6:
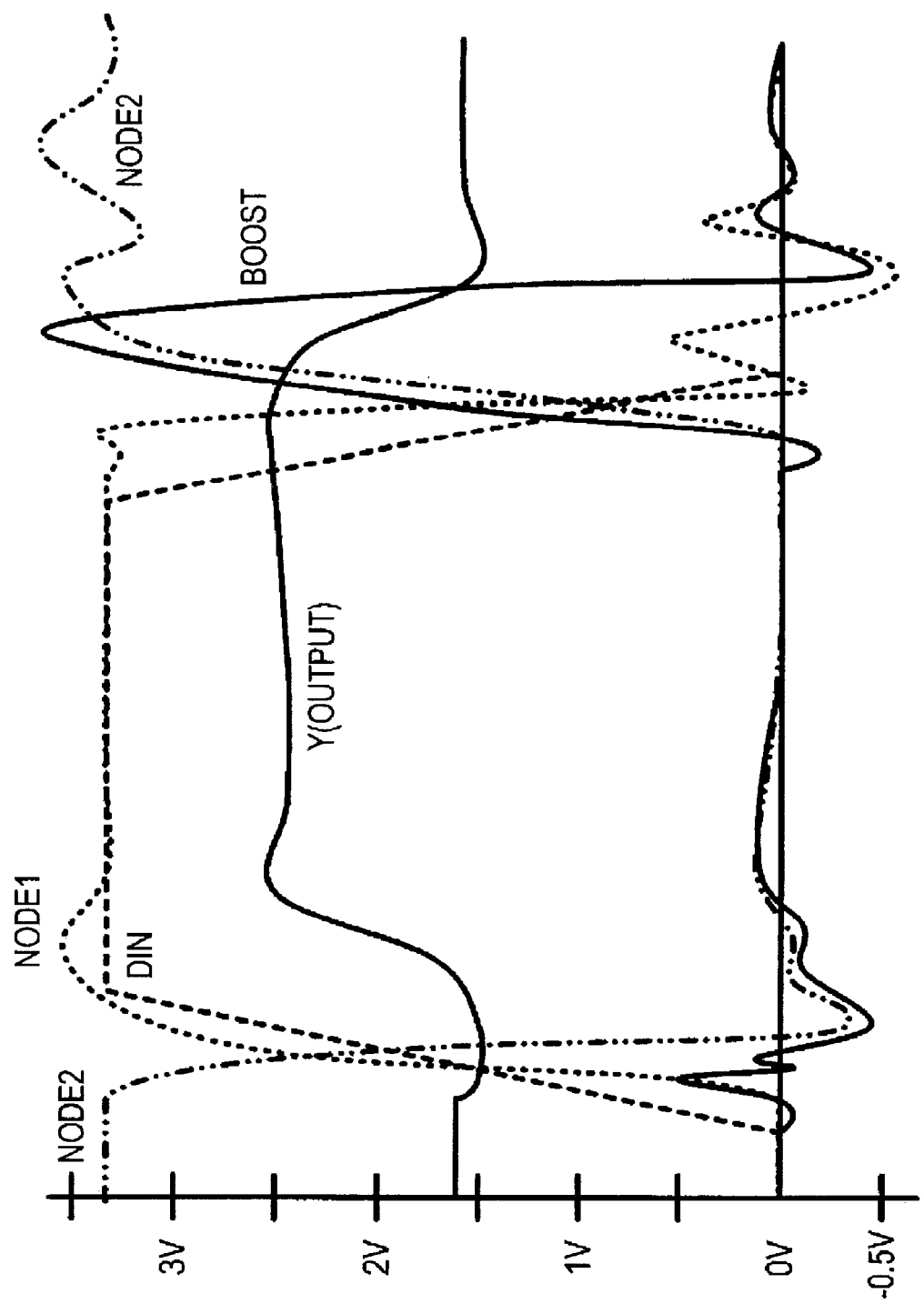
FIG. 6 is a waveform of the differential amplifier driving one of the differential outputs.

FIG. 6 is a waveform of the differential amplifier driving one of the differential outputs. Only one output Y of the two differential outputs Y1, Y2 is shown. The other output is generated by another differential amplifier and is basically the Y output mirrored about the 2-volt axis.

When the data input DIN swings from ground to a Vcc of 3.3 volts, NODE1 is driven high while NODE2 is driven low. This allows the IOH current to flow to output Y, charging it to a VOH of about 2.4 volts.

When data input DIN swings from high to low, NODE1 falls to ground while NODE2 rises to Vcc. The IOL current is connected to output Y and begins to lower output Y from VOH toward VOL.

The pulse generator generates the BOOST pulse for a short period of time after the falling transition of DIN. This BOOST pulse activates the boosted current sink, which quickly pulls output Y down to VOL. After a period of time, the BOOST pulse ends and only the IOL current from the current source is applied to output Y. Output Y swings from a VOH of about 2.4 volts down to a VOL of about 1.6 volts in this example.

The W/L size of the IOH current source transistor can be larger than the W/L size of the IOL current source transistor to make IOH larger than IOL. This produces a larger voltage drop through the terminating resistor for IOH than for IOL, assuming that the terminating voltage is below VOL. For example, IOH can be 20 mA while IOL is 5 mA to produce a VOH that is sufficiently above VOL.

ALTERNATE EMBODIMENTS

Several other embodiments are contemplated by the inventor. For example. A second current boost could be added in parallel to the IOH current source 54 (FIG. 3) to provide for a boosted pull-up current. This second boosted current source would be activated by a pulse generator that is triggered by the control signal to switch 34. Other VOL and VOH values could be substituted, and different terminating resistance and terminating voltage can be used. Different bias voltages could be applied to the current source transistors to provide different IOH and IOL currents even if the transistors had the same W/L ratio.

Connecting transistor 66 can be removed when coupling noise is not a concern to reduce area for the pull-down circuitry. Different biasing schemes can be used for generation of IOH, IOL: an off-chip resistor can be used (104) instead of an integrated one to have more programmability and better precision for IOH and IOL. An alternative timing can be used to control the current source and the boost current sink. For example, current source 60 can first be disabled during boosting and enabled again to attain steady VOL to further improve pull down speed. This scheme can also be implemented in BiCMOS technology in which precise current sources/sinks, stable biasing and reference circuitry are readily available.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential amplifier comprising:
    a first current source for supplying a first current;
    a first switch for connecting the first current to an output in response to a data signal;
    a second current source for supplying a second current;
    a second switch for connecting the second current to the output in response to an inverse of the data signal;
    a pulse generator that generates a boost pulse in response to a transition of the data signal; and
    a current sink for sinking a boost current from the output when the boost pulse is activated, but being disabled once the boost pulse ends;
        wherein the first current sets a voltage-output-high VOH level of the output when passing through an external resistor that receives the first current from the output;
        wherein the second current sets a voltage-output-low VOL level of the output when passing through the external resistor that receives the second current from the output,
        whereby static VOH and VOL levels are set by the first and second current sources, but the boost current increases a slew rate of the output toward VOL.

2. The differential amplifier of claim 1 wherein the first switch is a metal-oxide-semiconductor (MOS) transistor and the second switch is a MOS transistor.

3. The differential amplifier of claim 2 wherein the boost pulse is activated for a falling transition of the data signal but not for a rising transition of the data signal.

4. The differential amplifier of claim 3 wherein the first current is smaller than the second current, whereby the first and second current sources generate different currents to drive the output to different voltage levels.

5. The differential amplifier of claim 4 wherein the external resistor is connected to a line driven by the output and to a terminating voltage that is below VOL and below VOH.

6. The differential amplifier of claim 2 wherein the first current source is a p-channel transistor having a gate driven by a bias voltage and a source coupled to a power-supply voltage;

wherein the first switch is a p-channel transistor having a gate coupled to the data signal and a drain coupled to the output;

wherein the second current source is a p-channel transistor having a gate driven by the bias voltage and a source coupled to the power-supply voltage;

wherein the second switch is a p-channel transistor having a gate coupled to the inverse of the data signal and a drain coupled to the output;

wherein the current sink is an n-channel transistor with a gate that receives the boost pulse.

7. The differential amplifier of claim 6 further comprising:

a connecting transistor, coupled to conduct the boost current from the output to the current sink when the inverse of the data signal is activated.

8. The differential amplifier of claim 7 wherein the connecting transistor is an n-channel transistor connected in series with the current sink.

9. A current-boosting differential amplifier for driving an output comprising:

a first source transistor, having a gate connected to a bias voltage, a source connected to a power supply, and a drain connected to a first node, for sourcing a first current;

a first differential transistor, having a gate receiving a first data signal, for connecting the first node to the output;

a second source transistor, having a gate connected to a bias voltage, a source connected to the power supply, and a drain connected to a second node, for sourcing a second current;

a second differential transistor, having a gate receiving a second data signal, for connecting the second node to the output;

a data control circuit, receiving a data input, for generating the first data signal and the second data signal from the data input, the first data signal and the second data signal being generated as logical inverses of each other;

a pulse generator, coupled to the data control circuit, for generating a pulse when an input-data transition occurs; and a boost transistor, having a gate that receives the pulse from the pulse generator, for applying a boost current to the output in response to the pulse, the boost current increasing a rate of voltage change of the output while the pulse is activated;

wherein the output is driven to a first output voltage determined by a first current from the first source transistor and the first differential transistor when the first data signal activates the first differential transistor, but the output is driven to a second output voltage determined by a second current from the second source transistor and the second differential transistor when the second data signal activates the second differential transistor, whereby the boost transistor does not determine static voltage levels of the output after the pulse ends.

10. The current-boosting differential amplifier of claim 9 wherein the boost transistor is an n-channel transistor that sinks the boost current from the output to a ground.

11. The current-boosting differential amplifier of claim 10 further comprising:

a connecting transistor, having a gate connected to the second data signal, a drain connected to the output, and a source connected to a drain of the boost transistor, whereby the connecting transistor disconnects the boost transistor from the output when the second data signal is activated.

12. The current-boosting differential amplifier of claim 11 wherein the first differential transistor is a p-channel transistor, having a source connected to the first node, and a drain connected to the output;

wherein the second differential transistor is a p-channel transistor, having a source connected to the second node, and a drain connected to the output; and wherein the first and second source transistors are p-channel transistors.

13. The current-boosting differential amplifier of claim 12 further comprising:

a voltage-reference generator for generating the bias voltage to the first source transistor and the bias voltage to the second source transistor.

14. The current-boosting differential amplifier of claim 13 wherein the voltage-reference generator comprises:

a first voltage divider that outputs the bias voltage, the first voltage divider including a feedback transistor that outputs a feedback signal and with a gate driven by a comparator output;

a comparator that compares the feedback signal to a reference voltage to generate the comparator output to the feedback transistor.

15. The current-boosting differential amplifier of claim 9 wherein the output of the differential amplifier drives a true output line; further comprising a complement differential amplifier having reversed polarity of data signals, the complement differential amplifier comprising:

a third source transistor, having a gate connected to a bias voltage, a source connected to the power supply, and a drain connected to a third node, for sourcing a third current;

a third differential transistor, having a gate receiving a third data signal, for connecting the third node to a complement output;

a fourth source transistor, having a gate connected to a bias voltage, a source connected to the power supply, and a drain connected to a fourth node, for sourcing a fourth current;

a fourth differential transistor, having a gate receiving a fourth data signal, for connecting the fourth node to the complement output;

a second data control circuit, receiving a data input, for generating the third data signal and the fourth data signal from the data input, the third data signal and the fourth data signal being generated as logical inverses of each other, the third data signal also being a logical inverse of the first data signal, and the fourth data signal also being a logical inverse of the second data signal;

a second pulse generator, coupled to the data control circuit, for generating a complement pulse when an input-data transition occurs; and a second boost transistor, having a gate that receives the complement pulse from the second pulse generator, for applying a second boost current to the complement output in response to the complement pulse, the second boost current increasing a rate of voltage change of the complement output while the complement pulse is activated, wherein the output of the differential amplifier drives a true line and the complement output of the complement differential amplifier drives a complement line, the true line and the complement line being differential signals.

16. A pseudo-emitter-coupled logic (PECL) driver comprising:

a true differential amplifier for driving a true output;

a complement differential amplifier for driving a complement output;

wherein the true and complement differential amplifier each comprise:
   output-high current source means for generating an IOH current;
   high-driving transistor means for connecting the IOH current to an output in response to a first data signal;
   output-low current source means for generating an IOL current; low-driving transistor means for connecting the IOL current to the output in response to a second data signal;
   current boost means, activated by a pulse, for applying a boost current to the output in response to the pulse; and
   pulse means, activated by a transition of a data signal, for generating the pulse;

wherein the true differential amplifier drives the true output to a high voltage that is determined by the IOH current flowing through a first terminating resistor attached to the true output when the complement differential amplifier drives the complement output to a low voltage that is determined by the IOL current flowing through a second terminating resistor attached to the complement output, but the true differential amplifier drives the true output to a low voltage that is determined by the IOL current flowing through the first terminating resistor attached to the true output when the complement differential amplifier drives the complement output to a high voltage that is determined by the IOH current flowing through the second terminating resistor attached to the complement output, whereby differential signals are driven by the true and complement differential amplifiers with the boost current applied in response to the pulse.

17. The PECL driver of claim 16 wherein the output-high current source means comprises a p-channel transistor having a gate coupled to a bias voltage and a source coupled to a power supply;

wherein the high-driving transistor means comprises a p-channel transistor having a gate coupled to a data signal;

wherein the output-low current source means comprises a p-channel transistor having a gate coupled to the bias voltage and a source coupled to the power supply;

wherein the low-driving transistor means comprises a p-channel transistor having a gate coupled to a data signal;

wherein the current boost means comprises an n-channel transistor having a gate that receives the pulse, and a source coupled to a ground.

18. The PECL driver of claim 17 wherein the true and complement differential amplifier each further comprise:

a connecting n-channel transistor having a source coupled to a drain of the current boost means and a drain coupled to the output.

19. The PECL driver of claim 18 wherein a voltage swing of the true output between a high voltage generated by the IOH current and a low voltage generated by the IOL current is less than 1 volt.

20. The PECL driver of claim 18 wherein the pulse is activated for a falling transition of the second data signal but not for a rising transition of the second data signal.

* * * * *